United States Patent
Afghahi et al.

(10) Patent No.: US 7,738,308 B2
(45) Date of Patent: Jun. 15, 2010

(54) MEMORY ROW AND COLUMN REDUNDANCY

(75) Inventors: Morteza Cyrus Afghahi, Coto De Caza, CA (US); Esin Terzioglu, Aliso Viejo, CA (US); Gil I. Winograd, Aliso Viejo, CA (US)

(73) Assignee: Novelies, LLC, Aliso Viejo, CA (US)

( * ) Notice: Subject to any disclaimer, the term of this patent is extended or adjusted under 35 U.S.C. 154(b) by 36 days.

(21) Appl. No.: 12/016,738

(22) Filed: Jan. 18, 2008

(65) Prior Publication Data
US 2008/0225613 A1    Sep. 18, 2008

Related U.S. Application Data

(63) Continuation of application No. PCT/US2006/032222, filed on Aug. 16, 2006.

(60) Provisional application No. 60/370,738, filed on Aug. 16, 2005.

(51) Int. Cl.
*G11C 7/00* (2006.01)

(52) U.S. Cl. .................. 365/200; 365/230.03; 365/201; 365/225.7

(58) Field of Classification Search .................. 365/200, 365/230.03, 201, 225.7
See application file for complete search history.

(56) References Cited

U.S. PATENT DOCUMENTS

| | | | |
|---|---|---|---|
| 5,388,076 A | | 2/1995 | Ihara |
| 5,469,390 A | * | 11/1995 | Sasaki et al. ................. 365/200 |
| 5,848,009 A | * | 12/1998 | Lee et al. ..................... 365/200 |
| 5,959,906 A | * | 9/1999 | Song et al. ................... 365/200 |
| 6,678,195 B2 | * | 1/2004 | Hidaka ........................ 365/200 |
| 7,349,253 B2 | * | 3/2008 | Perner et al. ............ 365/185.09 |
| 2003/0103394 A1 | * | 6/2003 | Koshikawa ................. 365/200 |
| 2006/0052247 A1 | | 3/2006 | Beaudegnies |

OTHER PUBLICATIONS

PCT Search Report for PCT/US06/32222, publication date May 21, 2007, 7 pages attached.

* cited by examiner

*Primary Examiner*—Connie C Yoha
(74) *Attorney, Agent, or Firm*—Haynes & Boone, LLP

(57) ABSTRACT

In one embodiment, a memory includes a row and/or column redundancy architecture that uses binary cells to indicate whether a given row or column of memory cells is faulty. The binary cell is adapted to store a "repair true" signal in response to a conventional access to the corresponding row or column and also the assertion of a set signal.

13 Claims, 4 Drawing Sheets

US 7,738,308 B2

MEMORY ROW AND COLUMN REDUNDANCY

RELATED APPLICATION

This application is a continuation of International Application No. PCT/US2006/32222, filed Aug. 16, 2006, which in turn claims the benefit of U.S. Provisional Application No. 60/370,738, filed Aug. 16, 2005, the contents of both applications being incorporated by reference in their entirety.

BACKGROUND OF THE INVENTION

The present invention relates to memory circuits, and more particularly to memory circuits with row and column redundancy.

Despite advances in semiconductor process technology, integrated circuit memories may be manufactured with errors. Because a just single bit error may render a memory unusable, manufacturers have implemented various techniques to repair memories in which memory cells have been identified as faulty. For example, memories may include redundant rows or columns of memory cells. These redundant components are not used if the memory's non-redundant memory cells contain no manufacturing errors. If, however, a memory cell is faulty, a redundant memory component may be substituted for one of the non-redundant memory components such that the memory component including the faulty memory cell is no longer used. For example, a redundant row of memory cells is addressed in a row redundancy scheme only if a non-redundant row includes a faulty memory cell. Should a user desire to address the faulty row, the memory's row decoder addresses a substituted row instead.

It is conventional to organize memory rows into groups of one or more rows with regard to a row redundancy scheme. As used herein, each group of rows will be denoted as a "row-unit." Should a memory cell be faulty in a row-unit, that row-unit is no longer used and a substitute row-unit is used instead. With regard to the row-units, it is conventional to organize memory row-units into blocks such that each block includes its own X decoder as well as a redundant row-unit. A similar group organization may be implemented for the columns. For example, FIG. 1 illustrates a memory including a plurality of 8 memory blocks arranged from a block 0 to a block 7. Each block includes a redundant row-unit and is addressed by a corresponding X decoder and a Y driver (for illustration clarity, only the X decoders are illustrated). Consider an arrangement in which each block includes sixty-four row-units. Each X decoder must then be able to identify whether a row-unit is bad. For example, a one-bit signal may be used as a flag indicating whether a row-unit in a given block is faulty. Should there be 64 row-units, a six-bit signal is sufficient to indicate the identity of the faulty row. Each X decoder may thus couple to a corresponding seven-bit-wide redundancy information bus to receive the flag and address signals (for illustration clarity, only X decoder 7 is shown coupled to its seven-bit-wide bus).

Although each X decoder may thus identify whether a faulty row-unit exists, the X decoder must include a decoding portion to decode the contents of the bus, thereby occupying valuable die space. Moreover, the routing of the necessary buses complicates design. Finally, the demand on the input/output (I/O) resources can be considerable. For example, 56 I/O pins would need to be reserved for the row redundancy information for the memory of FIG. 1 (7 bits times 8 blocks).

Accordingly, there is a need in the art for improved row and column redundancy architectures.

SUMMARY

This section summarizes some features of the invention. Other features are described in the subsequent sections.

In accordance with a first aspect of the invention, a memory includes: a redundant row-unit having one or more rows of memory cells; a plurality of memory cells arranged according to rows, wherein the rows are arranged into a plurality of row-units such that each row-unit has the same number of rows, and wherein the redundant row-unit includes the same number of rows; a plurality of repair memory cells corresponding on a one-to-one basis with the plurality of row-units, each repair memory cell operable to store a repair true or false value signal; and an X decoder for addressing the rows, the X decoder adapted to respond to an address for a row-unit having a repair memory cell storing the repair true signal by addressing a unit selected from the remaining row-units and the redundant row-unit, wherein each repair memory cell is adapted to store the repair true signal in response to an assertion of a set signal and an addressing of the corresponding row-unit.

In accordance with a second aspect of the invention, a memory includes: a redundant column-unit having one or more columns of memory cells; a plurality of memory cells arranged according to columns, wherein the columns are arranged into a plurality of column-units such that each column-unit has the same number of columns, and wherein the redundant column-unit includes the same number of columns; a plurality of repair memory cells corresponding on a one-to-one basis with the plurality of column-units, each repair memory cell operable to store a repair true or false value signal; and a Y driver for driving the columns, the Y driver adapted to respond to an access for a column-unit having a repair memory cell storing the repair true signal by accessing a unit selected from the remaining column-units and the redundant column-unit, wherein each repair memory cell is adapted to store the repair true signal in response to an assertion of a set signal and a write operation for the corresponding column-unit.

The invention is not limited to the features and advantages described above. Other features are described below. The invention is defined by the appended claims.

BRIEF DESCRIPTION OF THE DRAWINGS

Embodiments of the present invention and their advantages are best understood by referring to the detailed description that follows. It should be appreciated that like reference numerals are used to identify like elements illustrated in one or more of the figures.

DETAILED DESCRIPTION

Reference will now be made in detail to one or more embodiments of the invention. While the invention will be described with respect to these embodiments, it should be understood that the invention is not limited to any particular embodiment. On the contrary, the invention includes alternatives, modifications, and equivalents as may come within the spirit and scope of the appended claims. Furthermore, in the following description, numerous specific details are set forth to provide a thorough understanding of the invention. The invention may be practiced without some or all of these specific details. In other instances, well-known structures and principles of operation have not been described in detail to avoid obscuring the invention.

Figure 2:
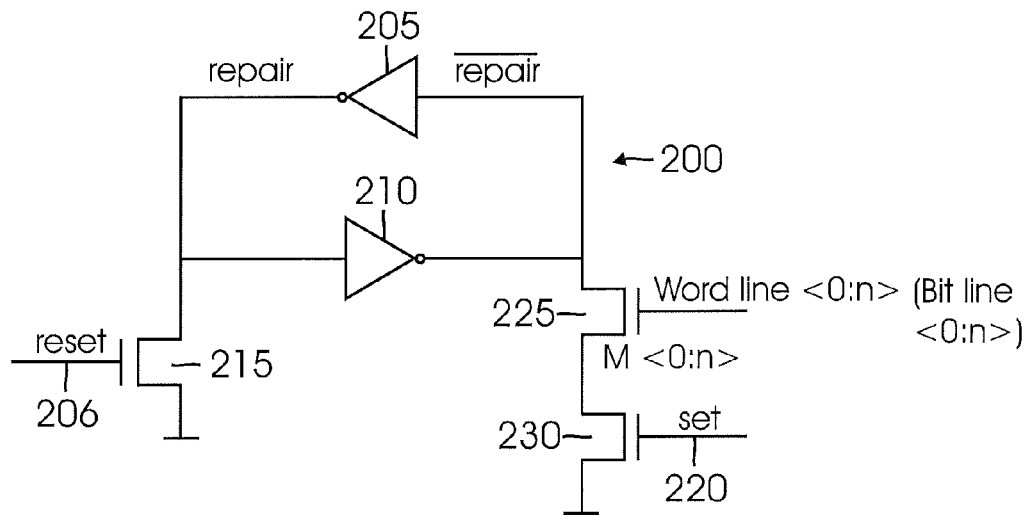
FIG. 2 illustrates aspects of a row redundancy architecture according to an embodiment of the invention.

Turning now to FIG. 2, a row redundancy architecture is shown that eases the I/O resource demands and die area demands discussed earlier by storing the row redundancy identification information in binary storage cells such as repair memory cell 200 represented by cross-coupled inverters 205 and 210. Each row-unit (not illustrated) has its own corresponding repair memory cell 200, which may comprise an SRAM cell, a non-volatile memory cell, or any other suitable memory cell. Repair memory cell 200 may be reset through the assertion of a reset signal 206 that drives a gate of a transistor 215. As used herein, "assertion" of a signal indicates the signal has a binary true state. Because the reset signal has been asserted, transistor 215 will be conducting such that a repair node in the memory cell is de-asserted (in this embodiment, by being pulled to ground potential through conducting transistor 215). Thus, repair memory cell 200 stores a "repair false" binary signal upon assertion of the reset flag.

If the row-unit corresponding to repair memory cell 200 has been identified as faulty, a user may invoke a redundancy row substitution by asserting a set signal 220 while accessing the row-unit such as through a write or read operation that raises a wordline within the row-unit. Note that a row-unit may include just a single row of memory cells (and hence a single word line) or may include multiple memory rows. If each row-unit includes a plurality of rows, the corresponding wordlines may be logically OR'ed to provide a wordline <0:n> signal 220. Should the number of rows (represented by an integer n) in each row-unit be 1, no logical OR operation would be necessary because wordline signal <0:n> 220 would simply be tied to the corresponding row-unit's single wordline. Regardless of how many rows correspond to each row-unit, the result of the access operation to the row-unit is that wordline signal <0:n> 220 is asserted. In turn, the assertion of this signal drives a transistor 225 to conduct. While transistor 225 is conducting, the assertion of the set signal drives a transistor 230 to conduct such that a repair complement node of the repair memory cell is de-asserted, whereby the repair memory cell stores a "repair true" binary signal.

Figure 1:
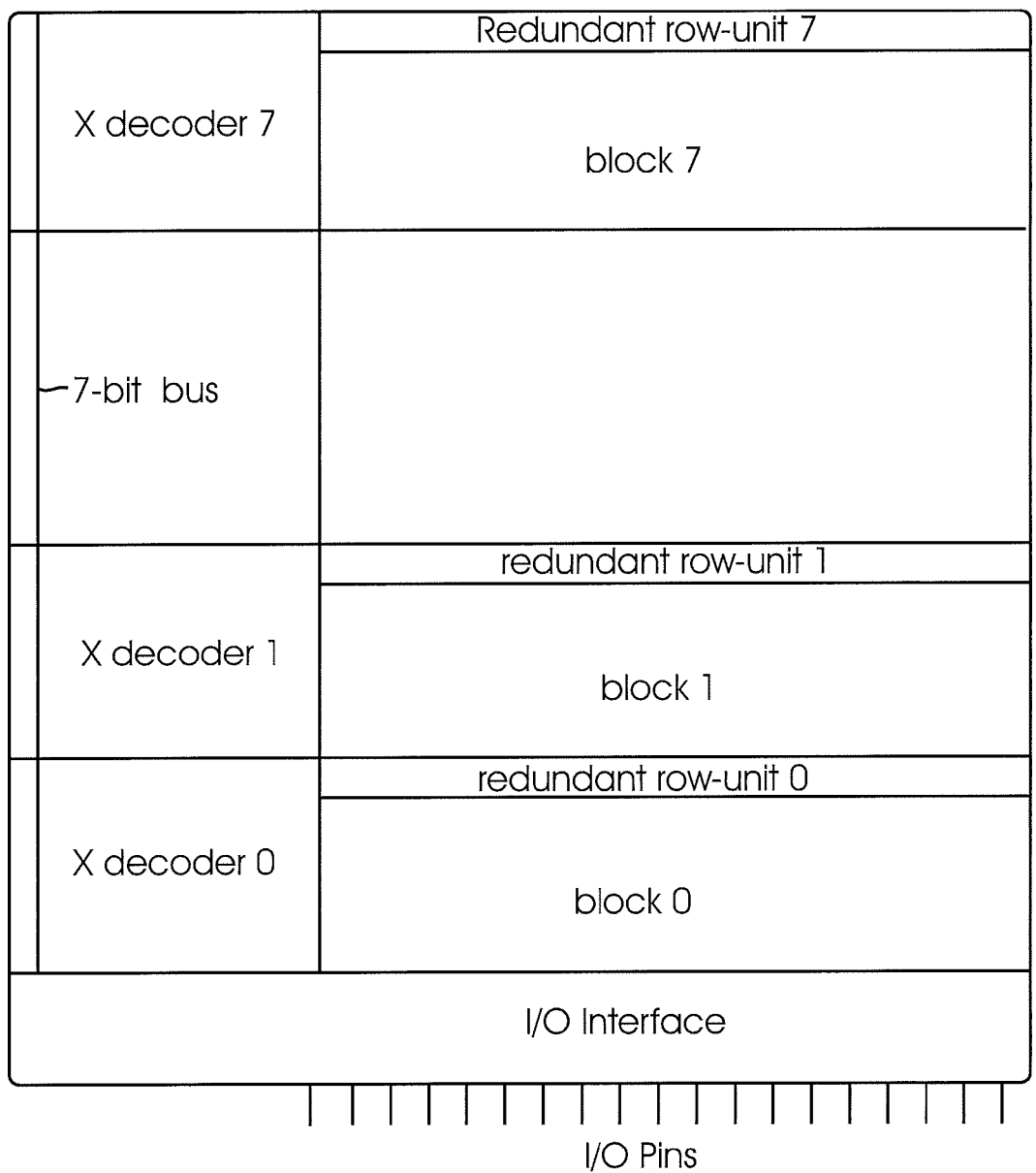
FIG. 1 is a block diagram of a conventional row redundancy architecture.

Note the advantages of such a row redundancy architecture—the access to assert the wordline signal <0:n> need merely use the already existing X decoder function. In other words, the user supplies the address of a wordline within the faulty row-unit, which is decoded by the row-unit's X decoder such that the corresponding wordline is asserted. The X decoder must already have such a decoding functionality because one could not otherwise assert wordlines within the row-unit during conventional read or write operations. Thus, no redundancy information decoding logic is necessary to decode the redundancy bus information discussed with regard to FIG. 1. Moreover, rather than reserve an abundance of I/O resources such as pins or pads to receive the redundancy bus information, a memory using the row redundancy architecture of FIG. 2 need merely reserve a set pin and an optional reset pin.

Figure 3:
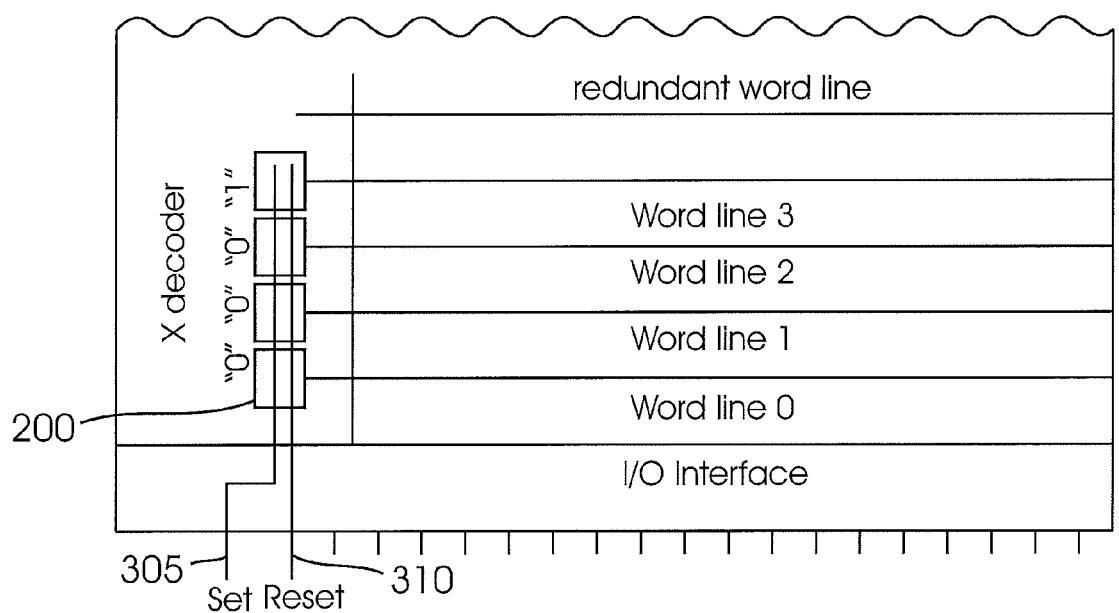
FIG. 3. illustrates a portion of a memory including the row redundancy architecture of FIG. 2.

Turning now to FIG. 3, a memory 300 is illustrated that includes the row redundancy architecture discussed with regard to FIG. 2. For illustration clarity, only a single block is illustrated having four wordlines arranged from a wordline 0 to a wordline 3. In this embodiment, each row-unit includes just a single wordline such that wordlines 0 through 3 may also be considered as row-units 0 through 3. It is convenient for the corresponding repair memory cells 200 to be included in the X decoder but they may be located in other areas as well. A user may assert the set and reset signals through pins 305 and 310, respectively. Suppose it is determined the row of memory cells (not illustrated) corresponding to wordline 3 includes a faulty cell. A user may then first assert the reset signal such that repair memory cells 200 store a "repair false" state (represented by logical zeroes). The set signal may then be asserted while an access operation such as a read operation specifying the address for wordline 3 is performed. Repair memory cell 200 for wordline 3 will thus store a "repair true" signal (represented by a logical one). The X decoder senses the assertion of the repair true signal for wordline 3 and will thus substitute one of the remaining wordlines or the redundant wordline during access operations that would otherwise access the memory row corresponding to wordline 3.

Figure 4:
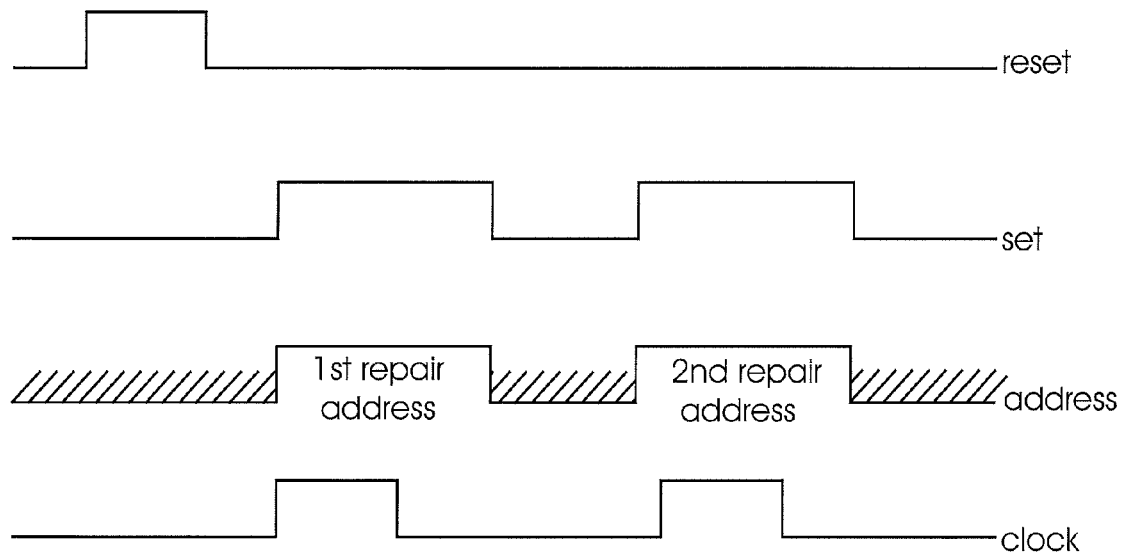
FIG. 4. is a timing diagram for the control signals of FIG. 2.

The operation of memory 300 may be better understood with regard to the timing diagram of FIG. 4. Before writing to the appropriate repair memory cells 200, a user has tested the memory and identified the faulty row(s). To write to repair memory cells 200 that correspond to the row-units including the faulty rows, a user may first assert the reset signal. In this embodiment, memory accesses are performed synchronously with a clock. Thus, when the clock is asserted, the user may perform an access operation such as a read or write to a row-unit including a faulty memory cell. Thus, a first repair address is provided corresponding to a wordline within the row-unit with the faulty row-unit so that the corresponding repair memory cell stores a repair true state. A second repair address (if necessary) is provided at the subsequent clock pulse, and so on. Simultaneously with the provision of the repair addresses, the set signal is asserted as discussed with regard to FIGS. 2 and 3.

It will be appreciated that an analogous scheme may be used to implement a column redundancy scheme. A column redundancy scheme may include analogs of row-units which will be denoted herein as "column-units." Each column-unit may include one or more bit lines that are grouped according to the memory blocks (each memory block having its own X decoder, Y driver, wordlines, and bitlines). Referring again to FIG. 2, transistor 225 would then be controlled by a bitline <0:n> signal that is formed analogously as discussed with regard to the wordline <0:n> signal. Thus, should each column-unit include a plurality of n bitlines, these bitlines are logically OR-ed to form the bitline <0:n> signal (it will be appreciated that in embodiments having both true and complement bit lines, just the logical true bit lines need be OR-ed). However, because the bitline must be driven with data, the access operation for a column redundancy implementation should be a write operation. In that regard, a corresponding row redundancy implementation could be made responsive to a read operation such that the set signal could be common to both the row and column redundancy schemes. In this fashion, just a single pin needs to be reserved for the set signal, there being no need for separate "row reset" and a "column reset" signals. The data input to the faulty memory cell's bit line would be driven with a binary one input while the corresponding wordline is also asserted. In embodiments that use column multiplexing, the column-unit may be selected through a combination of the input data and the address bits corresponding to the column multiplexer. As described previously, the same set signal may be used in a memory that incorporates both row and column redundancy. For example, the wordline <0:n> signal could be asserted only during read operations whereas the bitline <0:n> signal could be asserted only during write operations. In this fashion, a single set signal is shared with both the row and column redundancy schemes.

Figure 5:
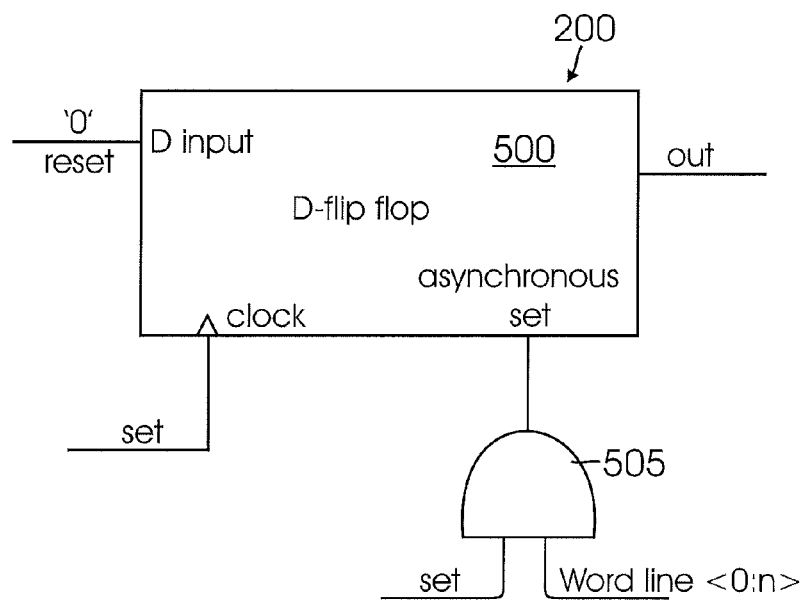
FIG. 5 illustrates an alternative memory cell configuration for storing the repair state information of FIG. 2.

Referring again to the use of an externally-provided reset signal, there are alternative redundancy implementations that do not require such a reset signal. For example, the reset pin may be eliminated through the use of a pulse generator that pulses the reset signal on the signal edge when the set signal is asserted. In such a case, the access operation (read or write) should be delayed sufficiently while the pulse generator pulses. The access operation would still be asserted, however, during the assertion of the set signal—the set signal would just be asserted slightly longer to account for the time during which the pulse generator pulses. Alternatively, memory cell 200 can be implemented using a flip-flop register 500 such as illustrated in FIG. 5 that includes an asynchronous set input. The D input is grounded whereas the set signal is tied to the clock input. In addition, the set signal as well as the wordline <0:n> signal (or bitline <0:n> signal in a column redundancy implementation) drives an AND gate 505 tied to the asynchronous set input.

Figure 6:
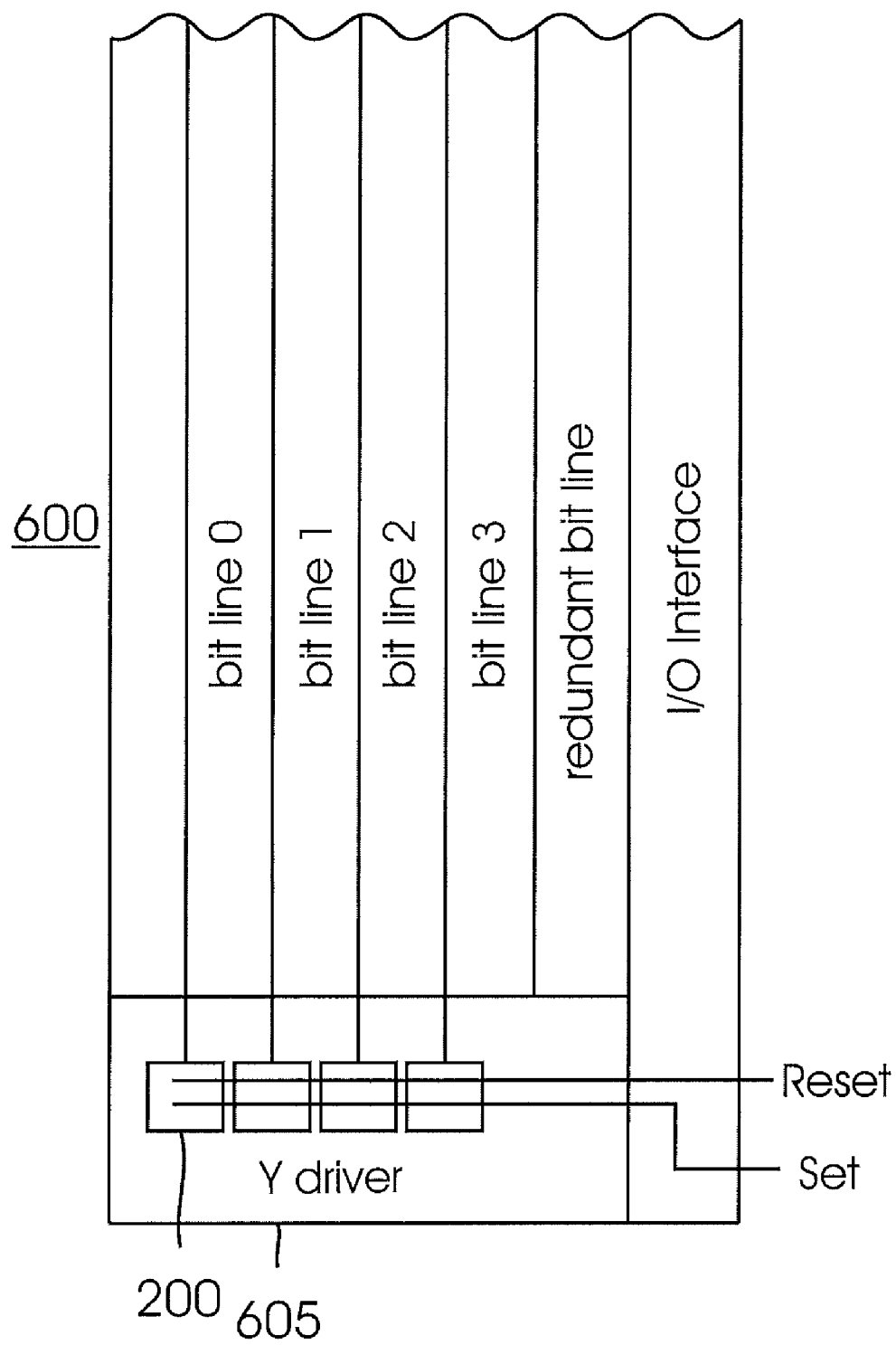
FIG. 6 illustrates portion of a memory include a column redundancy architecture according to an embodiment of the invention.

The operation of a memory with regard to a column redundancy implementation may be better understood with reference to FIG. 6. A memory 600 includes a Y driver 605 that reads the contents of repair memory cells 200. Unlike an X decoder, a Y driver need not decode addresses in that it simply reads (or writes) to all bit lines corresponding to a given word. In the embodiment shown in FIG. 6, each column-unit comprises a single bit line, arranged from a bit line 0 to a bit line 3 (it will be appreciated, however, that what is denoted as a "single bit line" may actually comprise a true and complement bit line depending upon the memory architecture). The corresponding redundant column-unit thus comprises a single redundant bit line. Should a column-unit be found to contain a faulty memory cell (such as bit line 0), the corresponding repair memory cell is driven to store a repair true signal by driving a logical one onto bit line 0 while the set signal is asserted. In response to reading the resulting repair true signal, Y driver 605 functions to substitute a unit selected from the remaining column-units and the redundant column-unit for the faulty column-unit.

The above-described embodiments of the present invention are merely meant to be illustrative and not limiting. For example, a memory need not be grouped into blocks to enjoy the benefits of the row and column redundancy architectures disclosed herein. Thus, the scope of the present invention is defined only by the following claims.

We claim:

1. A memory, comprising:
    a redundant row-unit having one or more rows of memory cells;
    a plurality of memory cells arranged according to rows, wherein the rows are arranged into a plurality of row-units such that each row-unit has the same number of rows, and wherein the redundant row-unit includes the same number of rows;
    a plurality of SRAM repair cells corresponding on a one-to-one basis with the plurality of row-units, each SRAM repair cell operable to store a repair true or false value signal, and wherein each SRAM repair cell is adapted to store a repair false signal in response to an assertion of a reset signal; and
    an X decoder for addressing the rows, the X decoder adapted to respond to an address for a row-unit having a repair memory cell storing the repair true signal by addressing a unit selected from the remaining row-units and the redundant row-unit, wherein each SRAM repair memory cell is adapted to store the repair true signal in response to an assertion of a set signal and an addressing of the corresponding row-unit.

2. The memory of claim 1, wherein the memory is incorporated in an integrated circuit, the integrated circuit including a pin for receiving the reset signal and a pin for receiving the set signal.

3. The memory of claim 1, wherein the memory is adapted such that each SRAM repair cell stores a repair true signal in response to the assertion of the set signal and an assertion of a wordline within the corresponding row-unit.

4. The memory of claim 3, wherein the memory is adapted such that the assertion of the wordline corresponds to a read operation.

5. The memory of claim 3, wherein the memory is adapted such that the assertion of the wordline corresponds to a write operation.

6. The memory of claim 1, wherein each SRAM repair cell comprises a flip-flop.

7. The memory of claim 6, wherein each row-unit includes an OR gate adapted to logically OR the row-unit's wordlines to form a wordline signal, and wherein each flip-flop has an asynchronous set input responsive to a logical AND of the set signal and the wordline signal.

8. The memory of claim 7, wherein each flip-flop has a D input tied to ground and a clock input tied to the set signal, whereby each flip-flop may be reset to store a repair false signal without requiring an external reset signal.

9. A memory, comprising:
    a redundant column-unit having one or more columns of memory cells;
    a plurality of memory cells arranged according to columns, wherein the columns are arranged into a plurality of column-units such that each column-unit has the same number of columns, and wherein the redundant column-unit includes the same number of columns;
    a plurality of SRAM repair cells corresponding on a one-to-one basis with the plurality of column-units, each SRAM repair cell operable to store a repair true or false value signal, wherein each SRAM repair cell is adapted to store a repair false signal in response to an assertion of a reset signal; and
    an Y driver for driving the columns, the Y driver adapted to respond to an access for a column-unit having a repair memory cell storing the repair true signal by accessing a unit selected from the remaining column units and the redundant column-unit, wherein each repair memory cell is adapted to store the repair true signal in response to an assertion of a set signal and a write operation for the corresponding column-unit.

10. The memory of claim 9, wherein the memory is incorporated in an integrated circuit, the integrated circuit including a pin for receiving the reset signal and a pin for receiving the set signal.

11. The memory of claim 9, wherein each SRAM repair cell comprises a flip-flop.

12. The memory of claim 11, wherein each column-unit includes an OR gate adapted to logically OR the column-unit's bitlines to form a bitline signal, and wherein each flip-flop has an asynchronous set input responsive to a logical AND of the set signal and the bitline signal.

13. The memory of claim 12, wherein each flip-flop has a D input tied to ground and a clock input tied to the set signal, whereby each flip-flop may be reset to store a repair false signal without requiring an external reset signal.

* * * * *